US010797044B2

(12) United States Patent
Zhou (10) Patent No.: US 10,797,044 B2
(45) Date of Patent: Oct. 6, 2020

(54) ELECTROSTATIC DISCHARGE PROTECTION DEVICE AND METHOD

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Fei Zhou, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/659,525

(22) Filed: Jul. 25, 2017

(65) Prior Publication Data

US 2018/0040605 A1 Feb. 8, 2018

(30) Foreign Application Priority Data

Aug. 2, 2016 (CN) .......................... 2016 1 0626293

(51) Int. Cl.
*H01L 27/02* (2006.01)
*H01L 29/66* (2006.01)
(Continued)

(52) U.S. Cl.
CPC .... *H01L 27/0266* (2013.01); *H01L 21/76895* (2013.01); *H01L 23/535* (2013.01);
(Continued)

(58) Field of Classification Search
CPC .............. H01L 27/0255; H01L 39/785; H01L 29/7391
See application file for complete search history.

(56) References Cited

U.S. PATENT DOCUMENTS 5,199,976 A 4/1993 Yau et al.
2005/0035410 A1* 2/2005 Yeo .......................... H01L 21/84
257/355

(Continued)

FOREIGN PATENT DOCUMENTS

CN 102593804 A 7/2012
CN 103515244 A 1/2014
(Continued)

OTHER PUBLICATIONS

European Application No. 17184173.7, Extended European Search Report dated Dec. 21, 2017, 8 pages.
(Continued)

*Primary Examiner* — Samuel A Gebremariam
*Assistant Examiner* — Jonas T Beardsley
(74) *Attorney, Agent, or Firm* — Kilpatrick Townsend & Stockton LLP (57) ABSTRACT

An electrostatic discharge (ESD) protection device includes a semiconductor substrate and a semiconductor fin located on the semiconductor substrate. The semiconductor fin includes a well region, a first doped region, and a second doped region. The first doped region and the second doped region are respectively adjacent to and being separated by a first portion of the well region. The device also includes a first gate structure on the semiconductor fin between the first doped region and the second doped region, and a first conductive structure electrically connecting the gate structure and the first doped region to a same potential. The ESD protection device can also have a third doped region and a second gate structure coupled to the same potential. The device also has a second conductive structure for connecting to a point between an external signal and a circuit to be protected.

15 Claims, 4 Drawing Sheets

(51) Int. Cl.
*H01L 29/861* (2006.01)
*H01L 21/768* (2006.01)
*H01L 23/535* (2006.01)
*H01L 29/08* (2006.01)
*H01L 29/10* (2006.01)
*H01L 29/423* (2006.01)
*H01L 29/78* (2006.01)
*H01L 29/49* (2006.01)

(52) U.S. Cl.
CPC ...... *H01L 27/0255* (2013.01); *H01L 29/0847* (2013.01); *H01L 29/1095* (2013.01); *H01L 29/42372* (2013.01); *H01L 29/66356* (2013.01); *H01L 29/66795* (2013.01); *H01L 29/7851* (2013.01); *H01L 29/861* (2013.01); *H01L 29/42312* (2013.01); *H01L 29/4966* (2013.01)

(56) References Cited

U.S. PATENT DOCUMENTS

| | | | |
|---|---|---|---|
| 2007/0267700 A1 | 11/2007 | Russ et al. | |
| 2010/0232077 A1* | 9/2010 | Worley | H01L 27/0255 361/56 |
| 2012/0112283 A1* | 5/2012 | Huang | H01L 21/84 257/350 |
| 2012/0176709 A1* | 7/2012 | Tsai | H01L 27/0255 361/56 |
| 2013/0221445 A1* | 8/2013 | Lei | H01L 21/28008 257/368 |
| 2014/0145249 A1* | 5/2014 | Tsai | H01L 29/7391 257/288 |
| 2017/0069615 A1* | 3/2017 | Sagong | H01L 27/0248 |

FOREIGN PATENT DOCUMENTS

| | | |
|---|---|---|
| CN | 103855156 A | 6/2014 |
| CN | 104081531 A | 10/2014 |
| CN | 105336690 A | 2/2016 |
| CN | 105513969 A | 4/2016 |
| TW | 201104757 A | 2/2011 |
| WO | 9622613 | 7/1996 |

OTHER PUBLICATIONS

Chinese Application No. 201610626293.3, Office Action dated May 20, 2019, 11 pages.

\* cited by examiner

ELECTROSTATIC DISCHARGE PROTECTION DEVICE AND METHOD

CROSS-REFERENCES TO RELATED APPLICATIONS

This application claims priority to Chinese patent application No. 201610626293.3, filed on Aug. 2, 2016, the content of which is incorporated herein by reference in its entirety.

BACKGROUND OF THE INVENTION

Embodiments of the present invention relates to semiconductor technology, and particularly relates to an electrostatic discharge (ESD) protection device and method.

As MOSFET (Metal Oxide Semiconductor Field Effect Transistor) device size is gradually reduced, the short channel effect becomes a key issue. FINFET (Fin Field Effect Transistor) devices exhibit good channel charge control, which can further reduce the size of CMOS devices.

With continued scaling, the devices are more susceptible to Electrostatic discharge (ESD) damage. Electrostatic discharge (ESD) is the sudden flow of electricity between two electrically charged objects caused by contact, an electrical short, or dielectric breakdown. ESD can cause damage to sensitive electronic devices. Conventional ESD protection circuits based on MOSFET device can be adapted to FINFET device.

However, the inventor has identified drawbacks of using FINFET devices in ESD protection circuits. For example, fin-type gate controlled devices are relatively narrow. When FINFET devices are used as the ESD protection devices, they are prone to relatively poor heat dissipation, leading to serious problems of self-heating, which may result in ESD device performance degradation.

Accordingly, there is a need for improved FINFET-based ESD protection device and method.

BRIEF SUMMARY OF THE INVENTION

According to some embodiments of the present invention, an electrostatic discharge (ESD) protection device includes a semiconductor substrate and a semiconductor fin located on the semiconductor substrate. The semiconductor fin includes a well region, a first doped region, and a second doped region. The first doped region and the second doped region are respectively adjacent to and being separated by a first portion of the well region. The device also includes a first gate structure on the semiconductor fin between the first doped region and the second doped region, and a first conductive structure electrically connecting the gate structure and the first doped region to a same potential.

In an embodiment, the well region has a first conductivity type, the first doped region has the first conductivity type with a dopant concentration greater than the dopant concentration of the well region. The second doped region has a second conductivity type opposite to the first conductivity type and has a dopant concentration greater than the dopant concentration of the well region.

In another embodiment, the first conductivity type is P-type and the second conductivity type is N-type. In this case, the first conductive structure electrically connects the gate structure and the first doped region to a ground terminal, and the second doped region electrically connects to a signal input terminal for receiving an external signal which includes a positive pulse voltage signal. When the positive pulse voltage signal is greater than a first predetermined threshold, the ESD protection device is turned on, and a current flows from the second doped region into the first doped region.

In another embodiment, the first conductivity type is N-type and the second conductivity type is P-type. In this case, the first conductive structure electrically connects the gate structure and the first doped region to a voltage supply terminal, the second doped region electrically connects the second doped region to a signal input terminal for receiving an external signal which includes a negative pulse voltage signal. When the negative pulse voltage signal is less than a first predetermined threshold, the ESD protection device is turned on, and a current flows from the second doped region into the first doped region and third doped region.

In another embodiment, the ESD device also includes a third doped region, separated from the second doped region by a second portion of the well region, and a second gate structure on the semiconductor fin and disposed between the second doped region and the third doped region. The ESD device also has a second conductive structure electrically connecting the second gate structure and the third doped region to the same potential as the first gate structure and the first doped region.

In another embodiment, the well region has a first conductivity type. The first doped region and the third doped region have the first conductivity type with a dopant concentration greater than the dopant concentration of the well region. The second doped region has a second conductivity type opposite to the first conductivity type and has a dopant concentration greater than the dopant concentration of the well region.

In another embodiment, the first conductivity type is P-type and the second conductivity type is N-type. In this case, the first conductive structure and the second conductive structure electrically connect the first gate structure, the second gate structure, the first doped region, and the third doped region to a ground terminal. The second doped region is electrically connected to a signal input terminal for receiving an external signal which includes a positive pulse voltage signal. When the positive pulse voltage signal is greater than a first predetermined threshold, the ESD protection device is turned on, and a current flows from the second doped region into the first doped region and third doped region.

In another embodiment, the first conductivity type is N-type and the second conductivity type is P-type. The first conductive structure and the second conductive structure electrically connects the first gate structure, the second gate structure, the first doped region, and the third doped region to a voltage supply terminal. The second doped region electrically connects to a signal input terminal for receiving an external signal which includes a negative pulse voltage signal. When the negative pulse voltage signal is less than a first predetermined threshold, the ESD protection device is turned on, and a current flows from the second doped region into the first doped region and third doped region.

In another embodiment, the first gate includes a gate insulator layer, a work function adjustment layer on the gate insulator layer, and a layer of conductive material on the work function adjustment layer. In some embodiments, the first conductivity type is P-type and the second conductivity type is N-type, and the work function adjustment layer is a P-type work function adjustment layer. In an embodiment, the P-type work function adjustment layer comprises titanium nitride or tantalum nitride.

In another embodiment, the first conductivity type is N-type and the second conductivity type is P-type, and the work function adjustment layer is an N-type work function adjustment layer. In an example, the material of N-type work function adjustment layer comprises a titanium alloy.

According to some embodiments of the present invention, a method for providing ESD (Electrostatic Discharge) protection for a circuit includes providing an ESD protection device, which includes forming a semiconductor substrate and forming a semiconductor fin located on the semiconductor substrate. The semiconductor fin includes a well region, a first doped region, and a second doped region. The first doped region and the second doped region are respectively adjacent to and separated by a first portion of the well region. Providing the ESD protection device also includes forming a first gate structure on the semiconductor fin. The method includes electrically connecting the first gate structure and the first doped region to a same potential, and electrically connecting the second doped region to a signal input terminal for receiving an external signal. The ESD protection device is disposed at a position between the external signal and a circuit configured for receiving the external signal.

In an embodiment of the above method, the well region has a first conductivity type. The first doped region has the first conductivity type with a dopant concentration greater than the dopant concentration of the well region. The second doped region has a second conductivity type opposite to the first conductivity type and has a dopant concentration greater than the dopant concentration of the well region.

In an embodiment, the first conductivity type is P-type and the second conductivity type is N-type. In this case, the first conductive structure electrically connects the first gate structure and the first doped region to a ground terminal. The second doped region is electrically connected to a signal input terminal for receiving an external signal which includes a positive pulse voltage signal. When the positive pulse voltage signal is greater than a first predetermined threshold, the ESD protection device is turned on, and a current flows from the second doped region into the first doped region.

In an embodiment, the first conductivity type is N-type and the second conductivity type is P-type. In this case, the first conductive structure electrically connects the first gate structure and the first doped region to a voltage supply terminal. The second doped region electrically connects the second doped region to a signal input terminal for receiving an external signal which includes a negative pulse voltage signal. When the negative pulse voltage signal is less than a first predetermined threshold, the ESD protection device is turned on, and a current flows from the second doped region into the first doped region and third doped region.

In an embodiment, providing an ESD protection device also includes forming a third doped region, separated from the second doped region by a second portion of the well region, and forming a second gate structure on the semiconductor fin and disposed between the second doped region and the third doped region. The method also includes electrically connecting the second gate structure and the third doped region to the same potential as the first gate structure and the first doped region.

In an embodiment, the well region has a first conductivity type, the first doped region and the third doped region have the first conductivity type with a dopant concentration greater than the dopant concentration of the well region, and the second doped region has a second conductivity type opposite to the first conductivity type and has a dopant concentration greater than the dopant concentration of the well region.

In an embodiment, the first conductivity type is P-type and the second conductivity type is N-type. In this case, the method includes electrically connecting the first gate structure, the second gate structure, the first doped region, and the third doped region to a ground terminal. The method also includes electrically connecting the second doped region to a signal input terminal for receiving an external signal which includes a positive pulse voltage signal. When the positive pulse voltage signal is greater than a first predetermined threshold, the ESD protection device is turned on, and current flows from the second doped region into the first doped region and third doped region.

In an embodiment, the first conductivity type is N-type and the second conductivity type is P-type. In this case, the method includes electrically connecting the first gate structure, the second gate structure, the first doped region, and the third doped region to a voltage supply terminal. The method also includes electrically connecting the second doped region to a signal input terminal for receiving an external signal which includes a negative pulse voltage signal. When the negative pulse voltage signal is less than a first predetermined threshold, the ESD protection device is turned on, and current flows from the second doped region into the first doped region and third doped region.

Embodiments of the present invention enable the electrical connection of the gate structure to the same potential with the first doped region. Further, embodiments of the present invention by using the gate structure and the first doped region is electrically connected to the same potential, so that the ESD protection device does not form a channel during operation, such that when the current through the ESD protection device. The current can flow over the larger area of the fin, and not form a large local current in a channel region. Device heating can be reduced, thereby reducing the likelihood of the ESD protection device performance degradation.

Further, some embodiments of the present invention may make the channel more difficult to turn on by incorporating a suitable working function adjustment layer in the gate structure.

Other features and advantages of the present invention will become apparent from the following detailed description of exemplary embodiments of the invention with reference to the accompanying drawings.

DETAILED DESCRIPTION OF THE INVENTION

Various exemplary embodiments of the present invention will now be described in detail with reference to the accompanying drawings. It should be noted that the relative arrangement, numerical expression and numerical values of the components and steps set forth in these embodiments, unless otherwise specified, do not limit the scope of the invention. At the same time, it will be appreciated that the dimensions of the various portions shown in the drawings are not drawn to scale in actuality for ease of description.

The following description of at least one exemplary embodiment is merely illustrative and is in no way intended as a limitation on the invention, its application or use. The techniques, methods, and apparatus known to those of ordinary skill in the relevant art may not be discussed in detail, but the techniques, methods, and apparatuses, as appropriate, should be considered as part of the specification. In all examples shown and discussed herein, any specific value should be construed as merely exemplary and not as limiting. Thus, other examples of exemplary embodiments may have different values. It should be noted that like reference numerals and letters designate like items in the following drawings, and therefore, once an item is defined in a drawing, it is not necessary to further discuss it in the subsequent figures.

Figure 1:
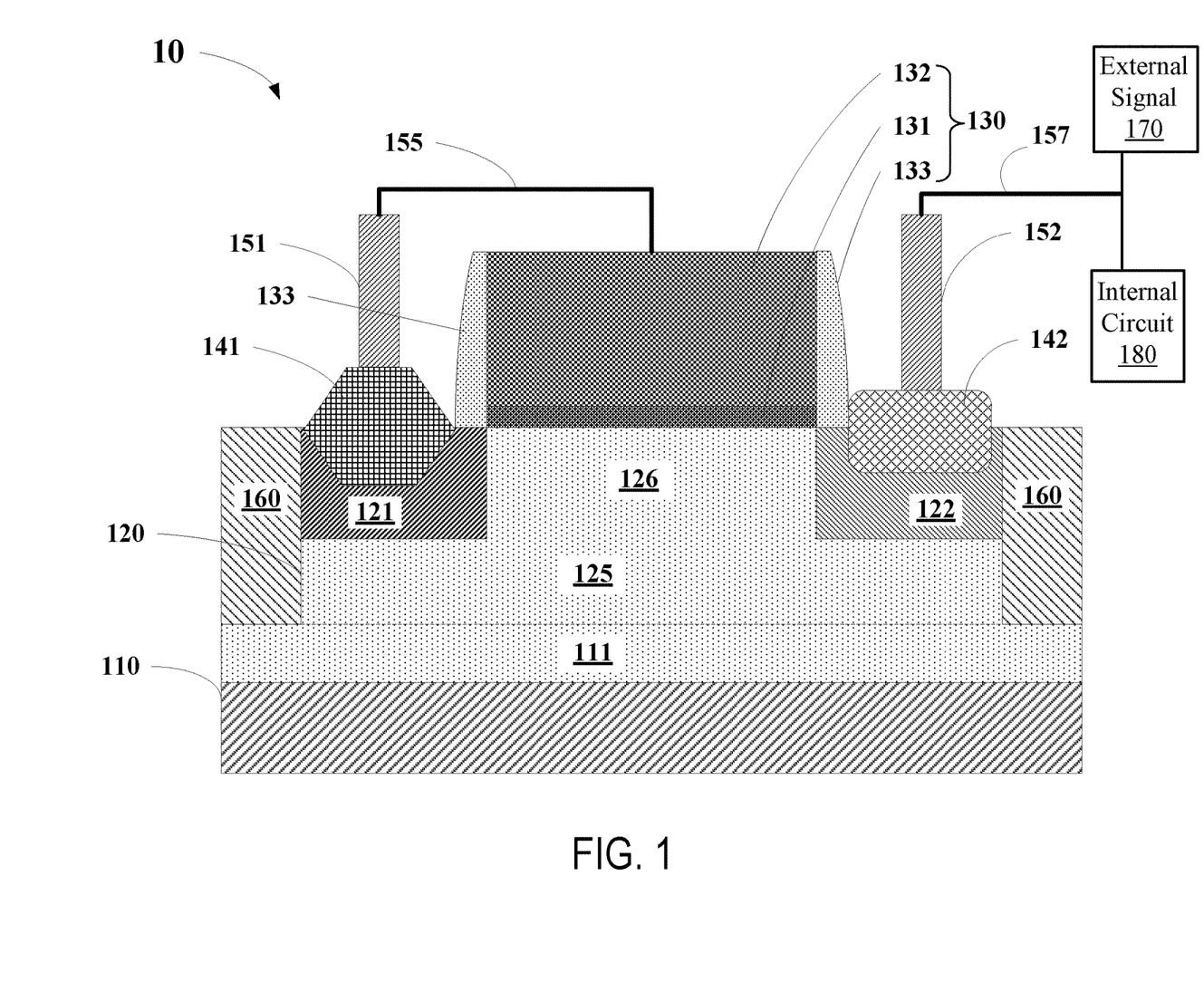
FIG. 1 is a cross-sectional view illustrating an ESD protection device according to some embodiments of the present invention.

FIG. 1 is a cross-sectional view illustrating an ESD protection device according to some embodiments of the present invention. As shown in FIG. 1, the ESD protection device 10 may include a semiconductor substrate (e.g. silicon substrate) 110, a semiconductor fin (e.g. silicon fin) 120 overlying the semiconductor substrate 120, and a gate structure 130 overlying semiconductor fin 120. The semiconductor fin can comprise: a well region (also referred to as a first region) 125, a first doped region 121, and a second doped region 122. The first doped region 121 and the second doped regions 122 are adjacent to and being spaced apart from each other by a portion 126 of the well region 125. The gate structure 130 is electrically connected, via a conductive structure 155, which can be an interconnect line, to the same potential as the first doping region 121.

In one embodiment, the well region 125 has a first conductivity type. The first doped region 121 has the first conductivity type, whose doping concentration greater than a doping concentration of the well region 125. The second doped region 122 has a second conductivity type opposite the first conductivity type, whose doping concentration is greater than the doping concentration of the well region 125. The gate structure and the first doped region are electrically connected to the same potential, so that the ESD protection device does not turn on the channel during operation, allowing the current through the ESD protection device to flow through a larger region in the fin. This device can prevent large localized current and can reduce device heating, thereby reducing the likelihood of degradation of the ESD protection device performance.

In one embodiment, gate structure 130 may include a gate insulator layer 131 on the surface portion of the semiconductor fins 120 (which may comprise, for example, a silicon oxide layer), a gate electrode 132 on the gate insulator layer 131, and spacer regions 133 (e.g. silicon oxide and/or silicon nitride) on both side surfaces of the gate electrode 132. The gate electrode 132 is electrically connected to the first doped region 121 to the same potential. The second doped region 122 is electrically connected to a signal input terminal (not shown) receiving an external signal 170.

As shown in FIG. 1, ESD protection device 10 may further include a first electrode 141 in the first doped region 121 and a second electrode 142 in the second doped region 122.

In one embodiment, shown in FIG. 1, the ESD protection device 10 may further include a first contact member 151 in contact with the first electrode 141, and a second contact member 152 in contact with the second electrode 142. The first contact member 151 is connected to the gate electrode 132 through conductive structure 155, and the second contact member 152 is electrically connected through another conductive structure 157 to a signal input terminal (not shown) for receiving an external signal. In other words, gate 132 is connected to the first electrode 141 and the first doping region 121 through the first contact member 151. The second doping region 122 is connected to a signal input for receiving an external signal through the second electrode 142 and the second contact member 152. Conductive structure 157 is provided for connecting the second doped region 122 to an external signal 170 at a point between the external signal 170 and a circuit 180 to be protected.

In one embodiment, shown in FIG. 1, the semiconductor substrate 110 may include a second region 111 having a first conductivity type. The second region 111 is adjacent to the well region 125. For example, the doping concentration of the second region 111 can have a doping concentration the same as that in the well region 125. The second region 111 and the well region 125 may be used together as a well region.

In a particular application, the gate electrode 132 is electrically connected to the first doped region 121 to the same potential. The second doped region 122 is electrically connected to the signal input terminal (not shown) for receiving an external signal. Here, the external signal can enter through the signal input terminal to the protected internal circuit. That is, the ESD protection device may be disposed at a position where the external signal enters the internal circuit. The following examples illustrate various embodiments in conjunction with the ESD protection device during operation.

In one embodiment, the first conductivity type is P-type and the second conductivity type is N-type. The gate electrode 132 is electrically connected to the first doped region 121 to the ground. The external signal may be a positive pulse voltage signal. In this embodiment, the conductivity type of the well region 125 may be, for example, P-type. The conductivity type first doped region 121 may be, for example, P+type (here, "P+type" indicates that the conductivity type is P-type and the doping concentration is greater than the P-type doping concentration of the well region.). The conductivity type of the second doped region 122 may be, for example, N+type (here, "N+" represents an N-type conductivity type and the doping concentration is greater than the N-type doping of the well region.) In this case, the gate 132 is electrically connected to the first doped region 121 to the ground terminal, the second doped region 122 is electrically connected to the signal input terminal receiving an external signal, where the external signal is a positive pulse voltage signal. When the voltage of the external positive pulse signal is greater than a first predetermined threshold value (e.g. the first predetermined threshold value may be a positive value), i.e. when the second doped region 122 has excessive positive charge, the ESD protection device is turned on, generating a current from the second doped region 122 to the first doped region 121. Since the gate 132 is connected to ground, no channel is formed in the well region 125, thus generating a current flowing through the fin 120 over a large area, not forming a large local current. It is also easier to dissipate the heat from the current flow. The ESD protection device can reduce the possibility of ESD performance degradation, and also protect the internal circuit.

In another embodiment, the first conductivity type is N-type and the second conductivity type is P-type. Gate electrode 132 is electrically connected to the first doped region 121 to a supply voltage terminal (VDD). The external signal may be a negative pulse voltage signal. In this embodiment, the conductivity type of the well region 125 may be, for example, N-type, the conductivity type of the first doped region 121 may be, for example, N+type, the conductivity type of the second doped region 122 may be, for example, P+type. In this case, the gate 132 is electrically connected to the first doped region 121 to the supply voltage terminal. The second doped region 122 is electrically connected to the signal input terminal for receiving an external signal, where the external signal is a negative pulse voltage signal. When a negative pulse voltage signal is less than a second preset threshold (e.g., the second predetermined threshold value can be negative), i.e., with the second doping region 122 having excessive negative charges, the ESD protection device is turned on, generating a current from the first doped region 121 to the second doped region 122. Since the gate 132 is connected to a supply voltage terminal, no channel can be formed in the well region 125. Therefore, the current flowing through the fin 120 through a large area, not forming a large local current. It is also easier to dissipate the heat from the current flow. The ESD protection device can reduce the possibility of ESD performance degradation, and also protect the internal circuit.

Figure 2:
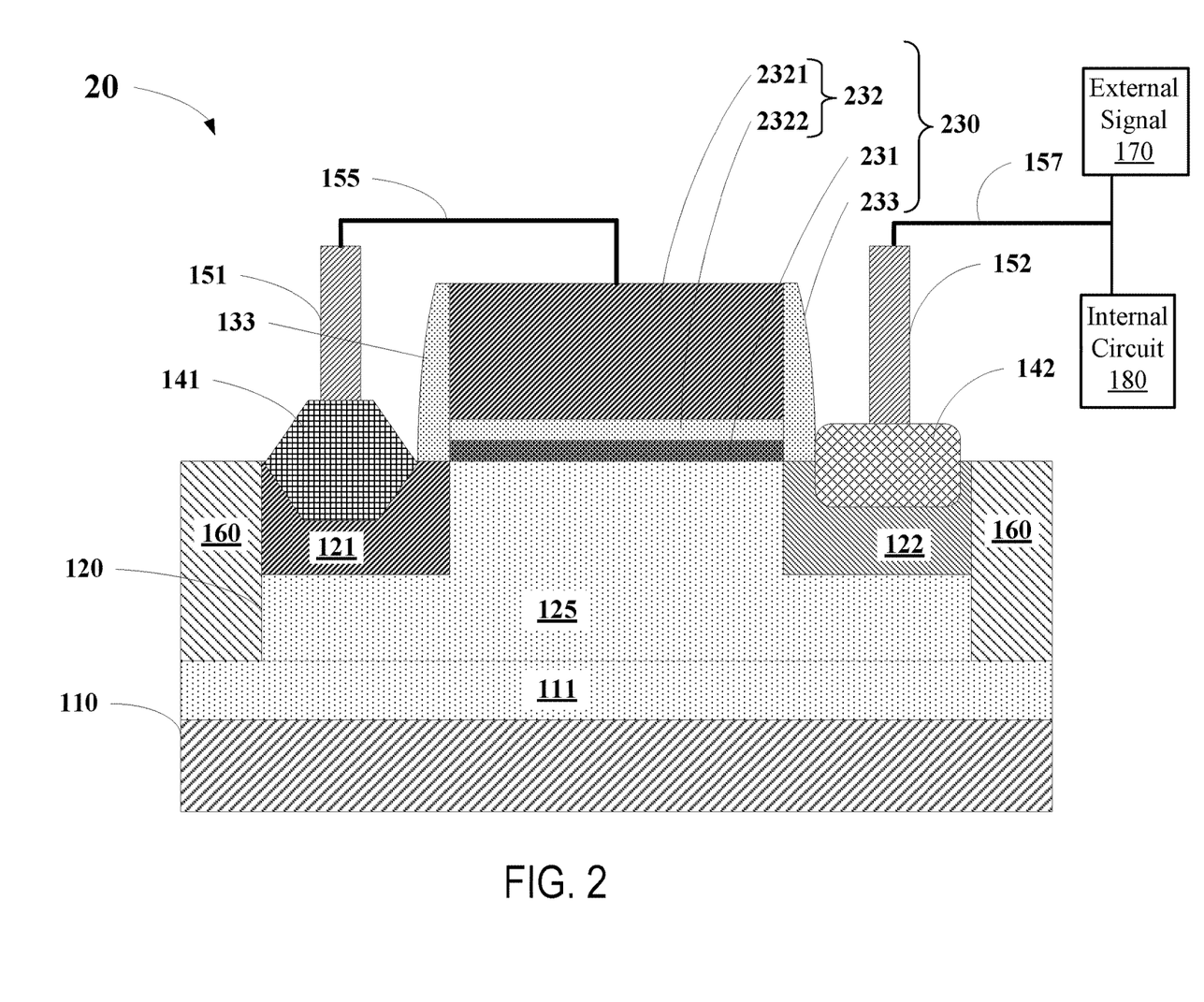
FIG. 2 is a cross-sectional view illustrating an ESD protection device according to another embodiment of the present invention.

FIG. 2 is a cross-sectional view illustrating an ESD protection device according to another embodiment of the present invention. As shown, an ESD protection device 20 includes structures similar to the ESD protection device 10 shown in FIG. 1. For example, a gate structure 230 shown in FIG. 2 includes a gate insulating layer 231 and spacers 233, similar to the gate insulating layer 131 and spacers 133, respectively, as shown in FIG. 1. Gate structure 230 further includes a gate electrode 232. These and other similar components are not described here.

In one embodiment, as shown in FIG. 2, gate 232 may include: a work function adjustment layer 2322 on the gate insulating layer 231 and a conductive material layer 2321 on the work function adjustment layer 2322. The material of the conductive material layer 2321 may include a metal such as tungsten, for example.

In one embodiment, the first conductivity type is P-type, the second conductivity type is N-type, and the work function adjustment layer 2322 is a P-type work function adjustment layer. For example, the material of the P-type work function adjustment layer may include titanium nitride (TiN) or tantalum nitride (TaN). In this embodiment, the conductivity type of the well region 125 may be, for example, P-type, the conductivity type of the first doped region 121 may be, for example, P+type, and the conductivity type of the second doped region 122 may be, for example, N+type. In this case, the P-type work function adjustment layer 2322 can raise the gate threshold voltage of the VT as compared with the gate threshold voltage of the N-type work function adjustment layer. For example, the gate threshold voltage VT can be raised from the original raised to 0.1V~0.4V to 0.6V~1.2V, so that it will be more difficult for the channel to form. Therefore, when the ESD protection device is turned on, the current flowing through the fin 120 through a large area, not forming a large local current. It is also easier to dissipate the heat from the current flow. The ESD protection device can reduce the possibility of ESD performance degradation, and also protect the internal circuit.

In another embodiment, the first conductivity type is N-type, the second conductivity type is P-type, and the work function adjustment layer 2322 is an N-type work function adjustment layer. For example, the material of the N-type work function adjustment layer may include titanium aluminum alloy (TiAl). In this embodiment, the conductivity type of the well region 125 may be, for example, N-type, the conductivity type of the first doped region 121 may be, for example, N+type, and the conductivity type of the second doped region 122 may be, for example, P+type. In this case, the N-type work function adjustment layer 2322 can raise the gate threshold voltage of the VT as compared with the gate threshold voltage of the P-type work function adjustment layer. For example, the gate threshold voltage VT can be raised from the original raised to 0.1V~0.4V to 0.6V~1.2V, so that it will be more difficult for the channel to form. Therefore, when the ESD protection device is turned on, the current flowing through the fin 120 through a large area, not forming a large local current. It is also easier to dissipate the heat from the current flow. The ESD protection device can reduce the possibility of ESD performance degradation, and also protect the internal circuit.

Figure 3:
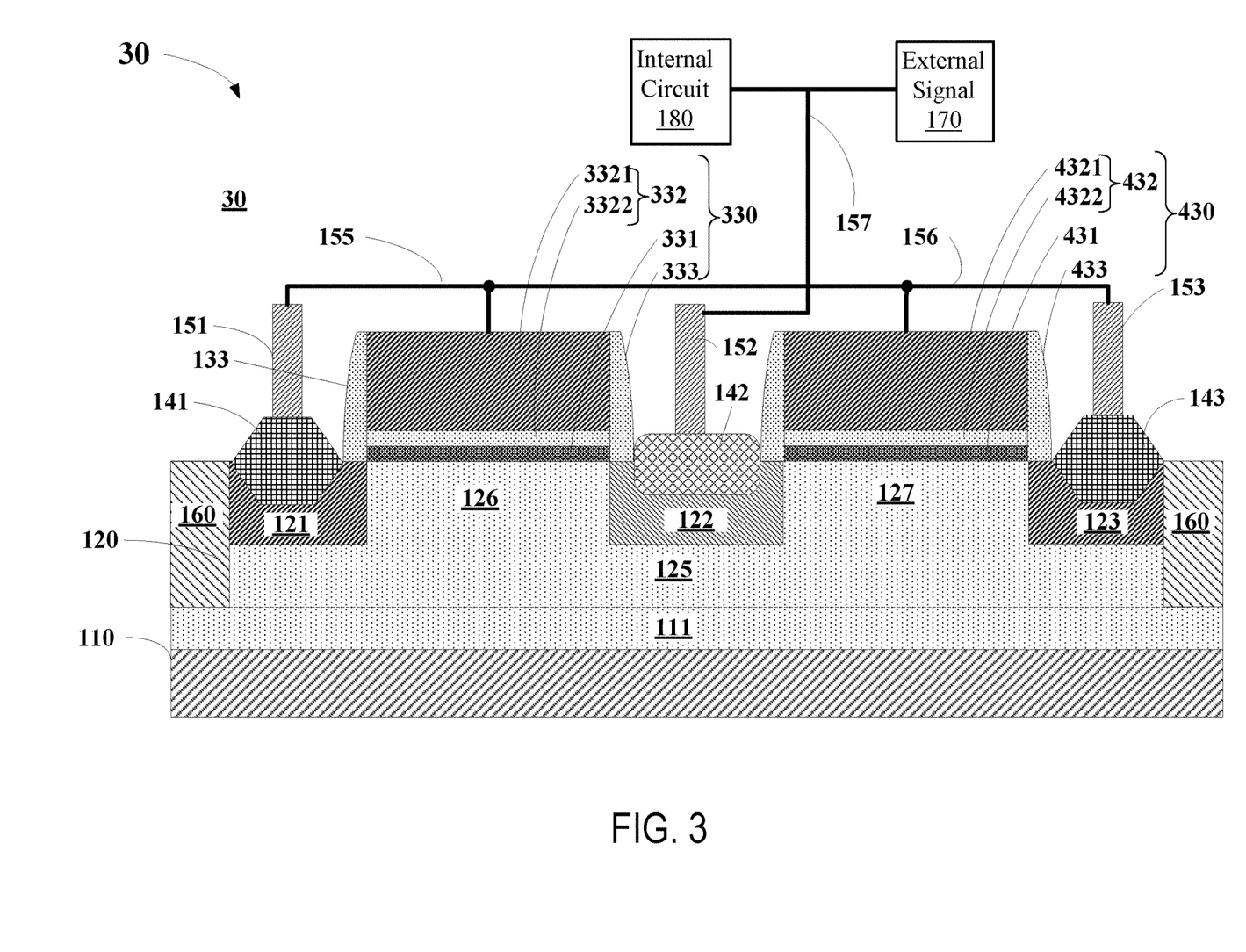
FIG. 3 is a cross-sectional view illustrating an ESD protection device according to yet another embodiment of the present invention.

FIG. 3 is a cross-sectional view illustrating an ESD protection device according to another embodiment of the present invention. As shown in FIG. 3, an ESD protection device 30 includes components similar to those of ESD protection devices 10 and 20, shown in FIG. 1 and FIG. 2, respectively. Therefore, those components are not described in detail.

In one embodiment, as shown in FIG. 3, the semiconductor fin 120 includes a first doped region 121, a second doped region 122, and a third region 123 spaced from the second doped region 122. The third doped region 123 has dopants with a first conductivity type. In an embodiment, the doping concentration of the third doping region 123 is greater than the doping concentration of the well region 125, which forms a well region in the device. It can be seen in FIG. 3 that the first doped region 121 and the second doped region 122 are adjacent to and are separated by a first portion 126 of well region 125. The second doped region 122 and the third doped region 123 are adjacent to and are separated by a second portion 127 of well region 125.

In one embodiment, shown in FIG. 3, the gate structure may include a first gate structure 330 over the semiconductor fin 120 and between the first doped region 121 and the second doped region 122. The gate structure may also include a second gate structure 430 over the semiconductor fin 120 and between the second doped region 122 and the third doped region 123. Here, the first gate structure 330 and the second gate structure 430 are similar to the gate structure 230 of FIG. 2. For example, the first gate structure 330 includes a first gate insulating layer 331, a gate electrode 332 (which includes a work function adjustment layer 3322 and a conductive material layer 3321), and spacers 333, which are similar to the gate structure 230 of FIG. 2, which includes gate insulating layer 231, gate electrode 232 (which includes work function adjustment layer 2322 and conductive material layer 2321) and spacers 233. As another example, the second gate structure 430 includes a gate insulating layer 431, a gate electrode 432 (which includes a work function adjustment layer 4322 and a conductive material layer 4321), and spacers 433, which are similar to the gate structure 230 of FIG. 2, which includes gate insulating layer 231, gate electrode 232 (which includes work function adjustment layer 2322 and conductive material layer 2321) and spacers 233.

In one embodiment, as shown in FIG. 3, gate electrode 332 of the first gate structure 330, gate electrode 432 of the second gate structure of the 430, the first doped region 121, and the third doped region 123 are electrically connected to the same potential. A first conductive structure 155 and a second conductive structure 156 are used for these connections. Conductive structures 155 and 156 can be interconnect lines made of conductive materials. Conductive structure 157 is provided for connecting the second doped region 122 to an external signal 170 at a point between the external signal 170 and a circuit 180 to be protected.

In one embodiment, as shown in FIG. 3, the ESD protection device 30 may further include a third electrode 143 partially formed in the third doped region 123 in semiconductor fin 120. A third contact member 153 is connected to the third electrode 143. The third contact member 153 is also connected to gate electrode 432 of the second gate structure 40.

The following examples illustrate various embodiments in conjunction with the operation of the ESD protection device 30.

In one embodiment, the first conductivity type is P-type and the second conductivity type is N-type. Gate electrode 332 of the first gate structure of the 330, gate electrode 432 of the second gate structure 430, the first doped region 121, and the third doped region 123 are electrically connected to a ground terminal. The external signal may be a positive pulse voltage signal. In this embodiment, the conductivity type of the well region 125 may be, for example, P-type. the conductivity type of the first doping region 121 and the third doping region 123 are P+type, for example. The second doped region 122 may be N+type. In this case, Gate electrode 332 of the first gate structure of the 330, gate electrode 432 of the second gate structure 430, the first doped region 121, and the third doped region 123 are electrically connected to a ground terminal. The second doped region 122 is electrically connected to the signal input terminal (not shown) for receiving an external signal, which is a positive pulse voltage signal. When the voltage of the external positive pulse signal is greater than a first predetermined threshold value, i.e., the second doped region 122 has excess positive charges accumulated, the ESD protection device is turned on. Under this condition, a current flows from the second doped region 122 to the first doped region 121 and the third doped region 123. Since the gate structures 332 and 432 are connected to the ground terminal, a conductive channel cannot be formed in the well region 125. Therefore, the current flows through the fin 120 over a large area, and not form a large localized current. The absence of a channel can reduce localized heating. ESD protective device 30 as shown FIG. 3 has a structure includes three doped regions enables the current to disperse in a large area of the fin structure. The ESD protection device can protect the internal circuit, and the likelihood of the ESD protection device performance degradation is reduced.

In another embodiment, the first conductivity type is N-type and the second conductivity type is P-type. Gate electrode 332 of the first gate structure of the 330, gate electrode 432 of the second gate structure 430, the first doped region 121, and the third doped region 123 are electrically connected to a voltage supply terminal (not shown). The external signal may be a negative pulse voltage signal. In this embodiment, the conductivity type of the well region 125 may be, for example, N-type. the conductivity type of the first doping region 121 and the third doping region 123 are N+type, for example. The second doped region 122 may be P+type. In this case, Gate electrode 332 of the first gate structure of the 330, gate electrode 432 of the second gate structure 430, the first doped region 121, and the third doped region 123 are electrically connected to a voltage supply terminal. The second doped region 122 is electrically connected to the signal input terminal (not shown) for receiving an external signal, which is a negative pulse voltage signal. When the voltage of the external negative pulse signal is greater than a second predetermined threshold value, i.e., the second doped region 122 has excess negative charges accumulated, the ESD protection device is turned on. Under this condition, a current flows from the first doped region 121 and the third doped region 123 to the second doped region 122. Since the gate structures 332 and 432 are connected to the voltage supply terminal, a conductive channel cannot be formed in the well region 125. Therefore, the current flows through the fin 120 over a large area, and not form a large localized current. The absence of a channel can reduce localized heating. ESD protective device 30 as shown FIG. 3 has a structure includes three doped regions enables the current to disperse in a large area of the fin structure. The ESD protection device can protect the internal circuit, and the likelihood of the ESD protection device performance degradation is reduced.

Figure 4:
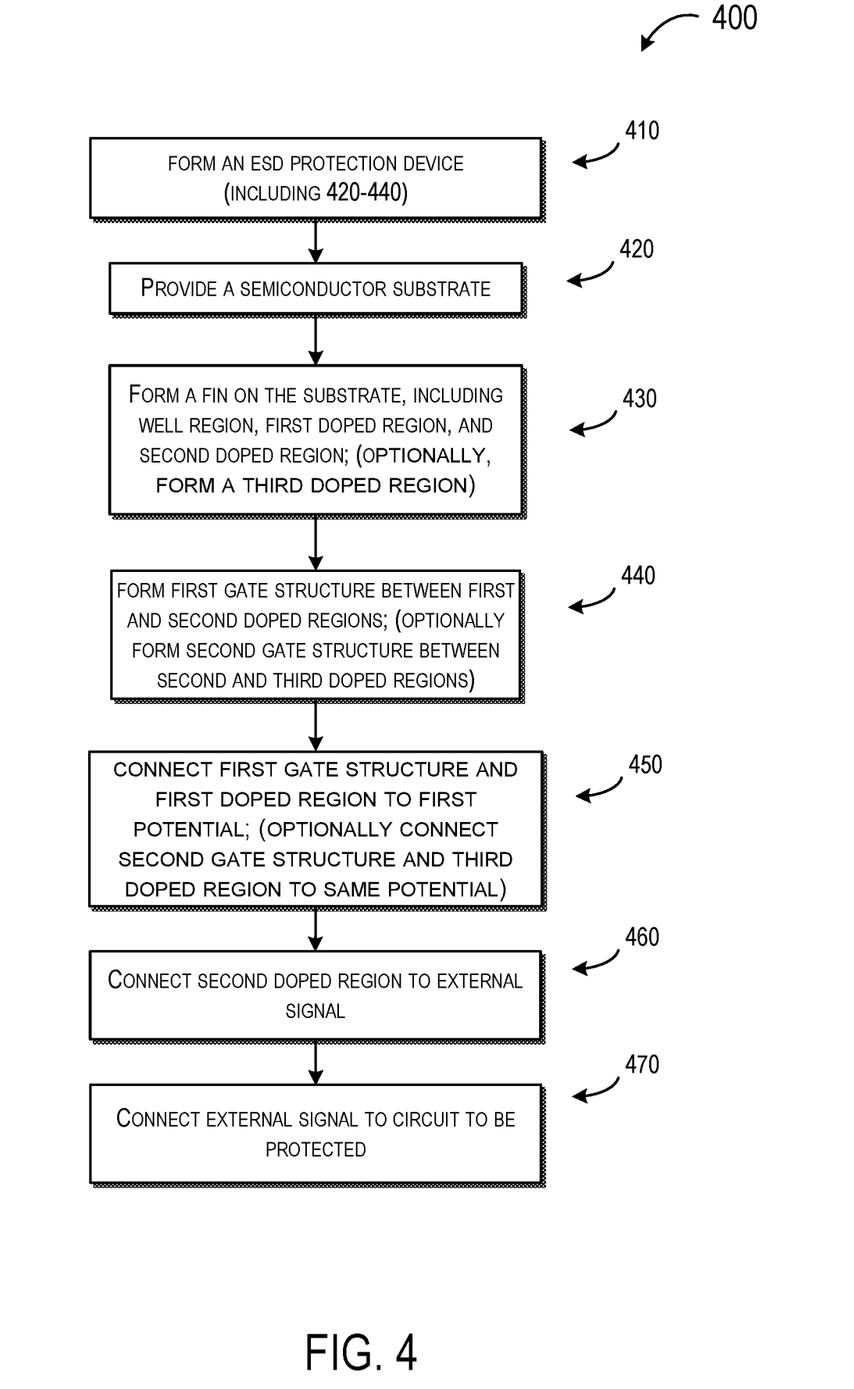
FIG. 4 is a flowchart illustrating a method for protecting circuit against ESD according to an embodiment of the present invention.

FIG. 4 is a flowchart 400 illustrating a method for protecting circuit against ESD according to an embodiment of the present invention. The method described below can be further illustrated with FIGS. 1-3 and the accompanying text.

According to some embodiments of the present invention, a method for providing ESD (Electrostatic Discharge) protection for a circuit includes providing an ESD protection device (410), which includes forming a semiconductor substrate (420) and forming a semiconductor fin located on the semiconductor substrate (430). The semiconductor fin includes a well region, a first doped region, and a second doped region. The first doped region and the second doped region are respectively adjacent to and separated by a first portion of the well region. Providing the ESD protection device also includes forming a first gate structure on the semiconductor fin (440). The method includes electrically connecting the first gate structure and the first doped region to a same potential (450), and electrically connecting the second doped region to a signal input terminal for receiving an external signal (460). The method also includes connecting the external signal to the circuit to be protected (470).

In an embodiment of the above method, the well region has a first conductivity type. The first doped region has the first conductivity type with a dopant concentration greater than the dopant concentration of the well region. The second doped region has a second conductivity type opposite to the first conductivity type and has a dopant concentration greater than the dopant concentration of the well region.

In an embodiment, the first conductivity type is P-type and the second conductivity type is N-type. In this case, the first conductive structure electrically connects the first gate structure and the first doped region to a ground terminal. The second doped region is electrically connected to a signal input terminal for receiving an external signal which includes a positive pulse voltage signal. When the positive pulse voltage signal is greater than a first predetermined threshold, the ESD protection device is turned on, and a current flows from the second doped region into the first doped region.

In an embodiment, the first conductivity type is N-type and the second conductivity type is P-type. In this case, the first conductive structure electrically connects the first gate structure and the first doped region to a voltage supply terminal. The second doped region electrically connects the second doped region to a signal input terminal for receiving an external signal which includes a negative pulse voltage signal. When the negative pulse voltage signal is less than a first predetermined threshold, the ESD protection device is turned on, and a current flows from the second doped region into the first doped region and third doped region.

In an embodiment, providing an ESD protection device also includes (430) forming a third doped region, separated from the second doped region by a second portion of the well region, and forming a second gate structure (440) on the semiconductor fin and disposed between the second doped region and the third doped region. The method also includes electrically connecting the second gate structure and the third doped region to the same potential as the first gate structure and the first doped region.

In an embodiment, the well region has a first conductivity type, the first doped region and the third doped region have the first conductivity type with a dopant concentration greater than the dopant concentration of the well region, and the second doped region has a second conductivity type opposite to the first conductivity type and has a dopant concentration greater than the dopant concentration of the well region.

In an embodiment, the first conductivity type is P-type and the second conductivity type is N-type. In this case, the method includes electrically connecting the first gate structure, the second gate structure, the first doped region, and the third doped region to a ground terminal. The method also includes electrically connecting the second doped region to a signal input terminal for receiving an external signal which includes a positive pulse voltage signal. When the positive pulse voltage signal is greater than a first predetermined threshold, the ESD protection device is turned on, and current flows from the second doped region into the first doped region and third doped region.

In an embodiment, the first conductivity type is N-type and the second conductivity type is P-type. In this case, the method includes electrically connecting the first gate structure, the second gate structure, the first doped region, and the third doped region to a voltage supply terminal. The method also includes electrically connecting the second doped region to a signal input terminal for receiving an external signal which includes a negative pulse voltage signal. When the negative pulse voltage signal is less than a first predetermined threshold, the ESD protection device is turned on, and current flows from the second doped region into the first doped region and third doped region.

Thus, embodiments of the present invention have been described in detail. To avoid obscuring the concepts, some details known in the art have not been described in detail. Those skilled in the art can fully understand how to implement the technical solution disclosed herein according to the above description. Although a detailed description of specific embodiments of the present invention by way of examples, those skilled in the art will appreciate that the above examples are intended only to be illustrative and not intended to limit the scope of the invention. Further, various embodiments as taught can be freely combined. Those skilled in the art will appreciate that the embodiments described above can have various modifications without departing from the scope and the spirit of the disclosure.

What is claimed is:

1. An electrostatic discharge (ESD) protection device, comprising:
    a semiconductor substrate;
    a semiconductor fin located on the semiconductor substrate, the semiconductor fin comprising:
        a well region;
        a first doped region having a first conductivity type; and
        a second doped region having a second conductivity type opposite the first conductivity type, wherein the first doped region and the second doped region are respectively adjacent to and being separated by a first portion of the well region;
    a first gate structure on said semiconductor fin between the first doped region and the second doped region, the first gate structure having first and second spacers on opposite sidewalls of the first gate structure, the first spacer on a surface portion of the first doped region, and the second spacer on a surface portion of the second doped region;
    a first conductive structure electrically connecting the first gate structure and the first doped region to a same potential;
    a second conductive structure for connecting the second doped region to a point between an external signal and a circuit to be protected;
    a third doped region, separated from the second doped region by a second portion of the well region;
    a second gate structure on the semiconductor fin and disposed between the second doped region and the third doped region; and
    a third conductive structure electrically connecting the second gate structure and the third doped region to the same potential as the first gate structure and the first doped region;
    wherein:
    the well region has the first conductivity type;
    the third doped region has the first conductivity type with a dopant concentration greater than a dopant concentration of the well region; and
    the second doped region has a dopant concentration greater than the dopant concentration of the well region.

2. The device of claim 1, wherein:
    the well region has the first conductivity type;
    the first doped region has a dopant concentration greater than a dopant concentration of the well region; and
    the second doped region has a dopant concentration greater than the dopant concentration of the well region.

3. The device of claim 2, wherein the first conductivity type is P-type and the second conductivity type is N-type, and wherein:
    the first conductive structure electrically connects the first gate structure and the first doped region to a ground terminal;
    the second doped region electrically connects to a signal input terminal for receiving an external signal which includes a positive pulse voltage signal;
    wherein, when the positive pulse voltage signal is greater than a first predetermined threshold, the ESD protection device is turned on, and a current flows from the second doped region into the first doped region.

4. The device of claim 2, wherein the first conductivity type is N-type and the second conductivity type is P-type, and wherein:
the first conductive structure electrically connects the first gate structure and the first doped region to a voltage supply terminal;
the second doped region electrically connects the second doped region to a signal input terminal for receiving an external signal which includes a negative pulse voltage signal;
wherein, when the negative pulse voltage signal is less than a second predetermined threshold, the ESD protection device is turned on, and a current flows from the second doped region into the first doped region.

5. The device of claim 1, wherein the first conductivity type is P-type and the second conductivity type is N-type, and wherein:
the first conductive structure and the third conductive structure electrically connect the first gate structure, the second gate structure, the first doped region, and the third doped region to a ground terminal;
the second doped region electrically connects to a signal input terminal for receiving an external signal which includes a positive pulse voltage signal;
wherein, when the positive pulse voltage signal is greater than a first predetermined threshold, the ESD protection device is turned on, and a current flows from the second doped region into the first doped region and third doped region.

6. The device of claim 1, wherein the first conductivity type is N-type and the second conductivity type is P-type, and wherein:
the first conductive structure and the third conductive structure electrically connects the first gate structure, the second gate structure, the first doped region, and the third doped region to a voltage supply terminal;
the second doped region electrically connects to a signal input terminal for receiving an external signal which includes a negative pulse voltage signal;
wherein, when the negative pulse voltage signal is less than a first predetermined threshold, the ESD protection device is turned on, and a current flows from the second doped region into the first doped region and third doped region.

7. The device of claim 1, wherein the first gate structure comprises:
a gate insulator layer;
a work function adjustment layer on the gate insulator layer; and
a layer of conductive material on the work function adjustment layer.

8. The device of claim 7, wherein the first conductivity type is P-type and the second conductivity type is N-type, and the work function adjustment layer is a P-type work function adjustment layer comprising titanium nitride or tantalum nitride.

9. The device of claim 7, wherein the first conductivity type is N-type and the second conductivity type is P-type, and the work function adjustment layer is an N-type work function adjustment layer comprising a titanium aluminum alloy.

10. The device of claim 1, wherein the first and second spacers each comprise silicon oxide or silicon oxide and silicon nitride.

11. The device of claim 1, wherein the second gate structure comprises third and fourth spacers on opposite sidewalls of the second gate structure, the third spacer on a surface portion of the second doped region and the fourth spacer on a surface portion of the third doped region.

12. The device of claim 11, wherein the third and fourth spacers each comprise silicon oxide or silicon oxide and silicon nitride.

13. The device of claim 1, further comprising:
a first electrode in the first doped region;
a first contact member in contact with the first electrode;
a third electrode in the third doped region; and
a third contact member in contact with the third electrode,
wherein the first contact member is electrically connected to the first gate structure through the first conductive structure, and the third contact member is electrically connected to the second gate structure through the third conductive structure.

14. The device of claim 13, further comprising:
a second electrode in the second doped region; and
a second contact member in contact with the second electrode,
wherein the second contact member is electrically connected to the external signal through the second conductive structure.

15. The device of claim 1, further comprising:
a first electrode in the first doped region;
a first contact member in contact with the first electrode;
a second electrode in the second doped region; and
a second contact member in contact with the second electrode,
wherein the first contact member is electrically connected to the first gate structure through the first conductive structure, and the second contact member is electrically connected to the external signal through the second conductive structure.

* * * * *